United States Patent [19]

Sachs et al.

[11] Patent Number: 5,427,101

[45] Date of Patent: Jun. 27, 1995

[54] DIMINISHING VARIANCE PROCESS FOR REAL-TIME REDUCTION OF MOTION ARTIFACTS IN MRI

[75] Inventors: Todd S. Sachs, Beachwood, Ohio; Craig H. Meyer; Dwight G. Nishimura, both of Palo Alto, Calif.

[73] Assignee: Board of Trustees of the Leland Stanford Junior University, Palo Alto, Calif.

[21] Appl. No.: 286,049

[22] Filed: Aug. 4, 1994

[51] Int. Cl.$^6$ .............................................. A61B 5/055
[52] U.S. Cl. .................. 128/653.2; 128/721; 324/309
[58] Field of Search .......... 128/653.1, 653.2, 716–721; 324/309; 364/413.13, 413.15; 378/901, 62

[56] References Cited

U.S. PATENT DOCUMENTS

| | | | |
|---|---|---|---|
| 4,616,180 | 10/1986 | Compton | 324/309 |
| 4,663,591 | 5/1987 | Pelc et al. | 324/309 |
| 4,720,678 | 1/1988 | Glover et al. | 324/309 |
| 4,930,508 | 6/1990 | Shimoni et al. | 128/653.2 |
| 5,035,244 | 7/1991 | Stokar | 128/653.2 |
| 5,051,903 | 9/1991 | Pelc et al. | 324/309 |
| 5,103,823 | 4/1992 | Acharya et al. | 128/653.1 |
| 5,138,259 | 8/1992 | Schmitt et al. | 324/309 |
| 5,254,948 | 10/1993 | Sano et al. | 324/309 |
| 5,323,110 | 6/1994 | Fielden et al. | 324/309 |

OTHER PUBLICATIONS

Sachs et al., Real-Time Motion Detection in MRI, Society of Magnetic Resonance in Medicine Twelfth Annual Scientific Meeting, 1993, p. 202.
Axel et al., Respiratory Effects In Two-Dimensional Fourier Transform MR Imaging, Radiology, vol. 160, Sep. 1986, pp. 795–801.
Ehman et al., Influence of Physiologic Motion on the Appearance of Tissue in MR Images, Radiology, vol. 159, Jun. 1986, pp. 777–782.
Wood et al., Suppression of Respiratory Motion Artifacts in Magnetic Resonance Imaging, Medical Physics, vol. 13, No. 6, Nov./Dec. 1986, pp. 794–805.
Glover et al., Projection Reconstruction Techniques for Reduction of Motion Effects in MRI, Magnetic Res. in Imaging, vol. 28, 1992, pp. 275–289.
Schultz et al., The Effect of Motin on Two-Dimensional Fourier Transformation Magnetic Resonance Images, Radiology, vol. 152, Jul. 1984, pp. 117–121.
Sachs et al., Real-Time Reduction of Motion Artifacts in Spiral MRI by Using Navigators, FIrst Meeting of the Society of Magnetic Resonance, 1994, p. 61.
Ehman et al., Adaptive Technique for High-Definition MR Imaging of Moving Structures, Radiology, vol. 173, pp. 255–263.
Korin et al., Compensation for Effects of Linear Motion in MR Imaging, Magnetic Resonance in Medicine, vol. 12, 1989, pp. 99–113.

*Primary Examiner*—Krista M. Pfaffle
*Attorney, Agent, or Firm*—Townsend and Townsend Khourie and Crew

[57] ABSTRACT

A method whereby motion can be detected in real time during the acquisition of MRI data. This enables the implementation of several algorithms to reduce or eliminate this motion from an image as it is being acquired. The method is an extension of the acceptance/rejection method algorithm called the diminishing variance algorithm (DVA). With this method, a complete set of preliminary data is acquired along with information about the relative motion position of each frame of data. After all the preliminary data is acquired, the position information is used to determine which lines are most corrupted by motion. Frames of data are then reacquired, starting with the most corrupted frame. The position information is continually updated in an iterative process, therefore each subsequent reacquisition is always done on the worst frame of data. The algorithm has been implemented on several different types of sequences, and preliminary in vivo studies indicate that motion artifacts are dramatically reduced.

14 Claims, 3 Drawing Sheets

DIMINISHING VARIANCE PROCESS FOR REAL-TIME REDUCTION OR MOTION ARTIFACTS IN MRI

This invention was made with Government support under contract NIH HL 39297 awarded by the National Institutes of Health. The Government has certain rights in this invention.

BACKGROUND OF THE INVENTION

This invention relates generally to magnetic resonance imaging (MRI), and more particularly the invention relates to real-time reduction of motion artifacts in MRI.

Magnetic resonance imaging apparatus is widely used in medical diagnosis applications. In very general terms, nuclear magnetic moments are excited at specific spin precession frequencies which are proportional to the local magnetic field. The radio-frequency signals resulting from the precession of the spins are received using pick-up coils. By manipulating the magnetic fields, an array signal is provided representing different regions of the volume. These can be combined to produce a volumetric image of the nuclear spin density of the body.

Referring to the drawing, FIG. 1A is a perspective view partially in section illustrating coil apparatus in a MR imaging system, and FIGS. 1B–1D illustrate field gradients which can be produced in the apparatus of FIG. 1A. This apparatus is discussed by Hinshaw and Lent, *An Introduction to NMR Imaging: From the Block Equation to the Imaging Equation*, PROCEEDINGS OF THE IEEE, Vol 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR-A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

The strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation, the nuclei gradually return to alignment with the static field and give up the energy in the form of weak but detectable free induction decay (FID). These DFID signals are used by a computer to produce images.

Motion continues to be a major stumbling block in imaging thoracic and abdominal structures. Be it bulk translations and rotations due to respiratory motion, partial field of view translations and rotations due to cardiac motion, or unpredictable spurious patient motion, the effect on the resultant image often completely obscures the fine detail that was originally sought.

The present invention is directed to detecting the presence of motion in real-time during a scan; that is, each frame of data is put through a test for motion directly after it is acquired, and before the next frame of data is acquired. With this scheme, the implementation of several different real-time processing algorithms is possible. An acceptance/rejection algorithm is one such method that has previously been discussed, and the invention presents a new algorithm which makes more efficient use of time, data, and a priori information.

SUMMARY OF THE INVENTION

Briefly, the invention utilizes a diminishing variance algorithm (DVA) to operate on a preliminary set of data frames. The first pass through the scan is identical to what it would have been without any real-time detection, with the exception that information about each frame's relative position is computed and kept track of during the scan. After the initial set of data has been acquired, it is possible in real-time to reacquire certain data lines that are deemed positionally worse than the others through a motion test.

The process in accordance with the invention is accomplished without the use of breath-holds and is designed to be dependent as little as possible on patient cooperation. Complicated instructions and/or physical challenges presented to an unwilling or unable patient are minimized as much as possible. It is also completely general, and can be implemented on any type of sequence. It has been implemented on several different types of sequences, and has yielded very promising results.

The invention and objects and features thereof will be more readily apparent from the following description and appended claims when taken with the drawings.

DETAILED DESCRIPTION OF ILLUSTRATIVE EMBODIMENTS

Figure 1A:
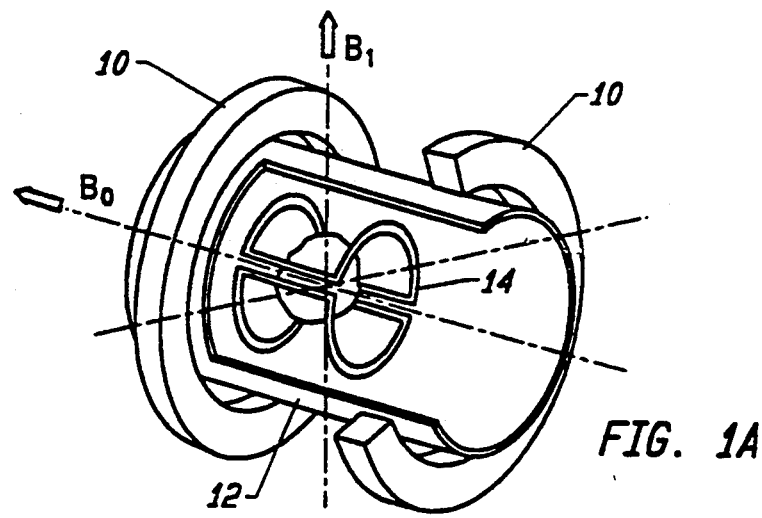
FIGS. 1A–1D illustrate arrangement of conventional MRI apparatus and magnetic fields generated therein.
Figures 1B, 1C, 1D:
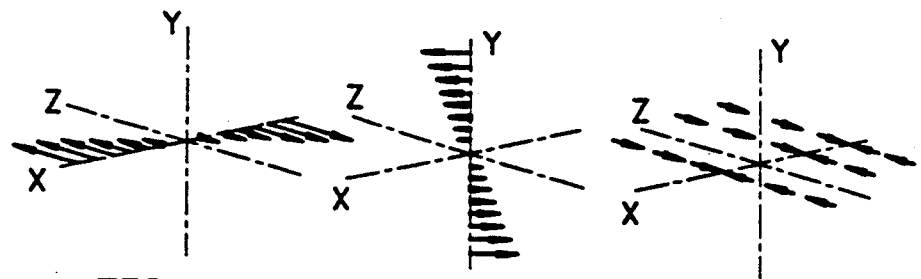
Figure 2:
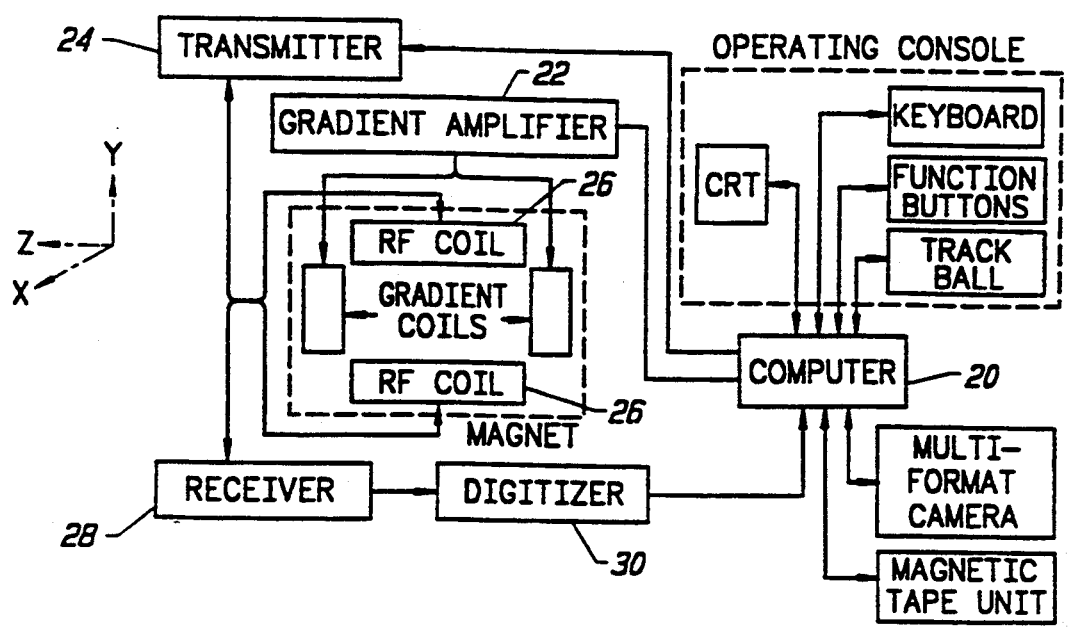
FIG. 2 is a functional block diagram of MRI imaging apparatus.
Figure 3:
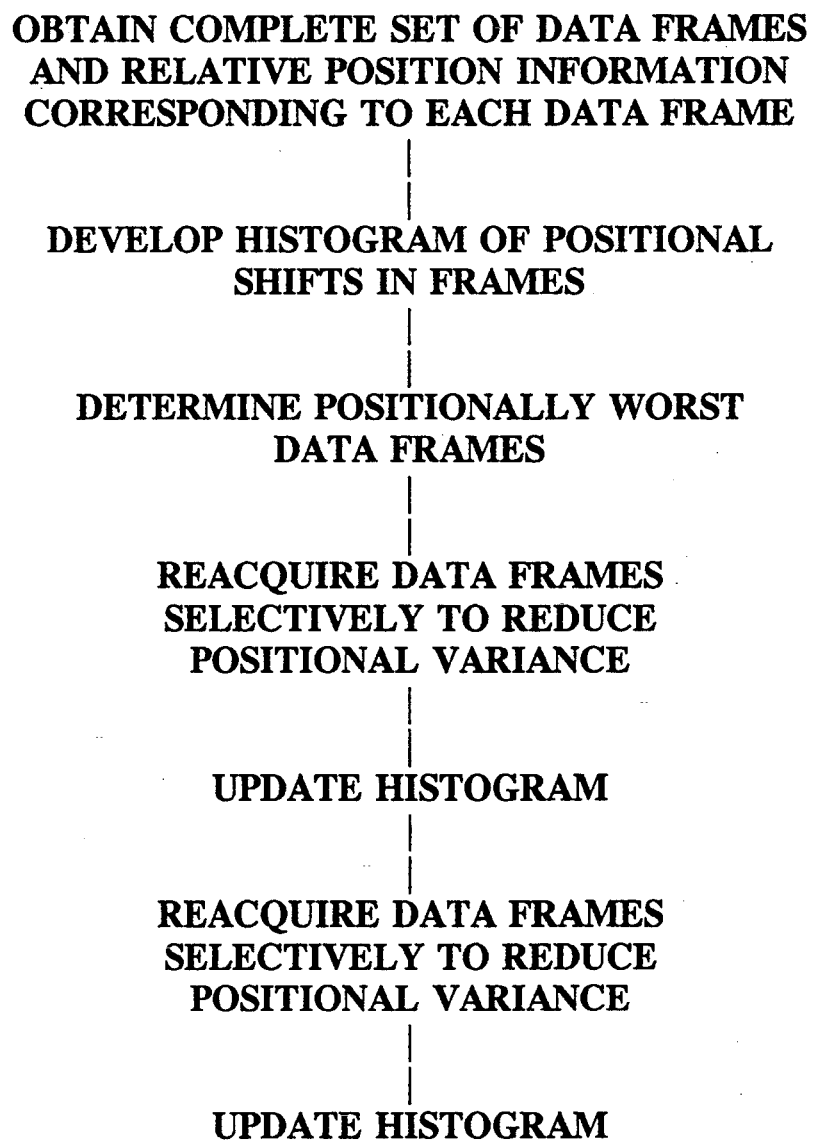
FIG. 3 is a flow diagram illustrating one embodiment of the invention.

Referring now to FIG. 3, a flow diagram of the diminishing variance process is illustrated. Initially, a complete set of data frames, as required to construct an image, is acquired with each frame having a mechanism for indicating a relative position of the frame. A histogram of positional shifts in the frames is then developed, and the positionally worst data frames due to motion are then reacquired. The histogram is updated, and the positionally worst data frames in the updated histogram are reacquired. This process is continued until an image which is motion free is realized. As used herein, a data frame is a portion of the data, typically a single line in k-space for 2DFT imaging or a simple spiral interleaf for interleaved spiral imagery.

The invention has been implemented using navigator echoes, as disclosed in Ehman et al., *Adaptive Technique for High-definition MR Imaging of Moving Structures*, RADIOLOGY 173:255-263 (1989), and Korin et al., *Compensation for Effects of Linear Motion in MR Imaging*, MAGNETIC RESONANCE IN MEDICINE 12:99-113 (1989). A navigator is acquired at the end of each data acquisition along each of the axes for which a motion test is desired. The scheme is based on the assumption that the motion is slow enough with respect to one acquisition that it will be reflected in both the data and the navigator. Alternatively, other sources of reference signals can be used, including motion sensors on the body being imaged.

Since the Fourier transform of a navigator echo is the resultant projection of the imaging field of view (FOV) through the axis of navigator, it has all the information necessary to resolve motion in that direction, as discussed in Ehman et al. and Korin et al., supra. Currently, a cross correlation between a reference projection and a test projection associated with a frame of data resolves the motion. The resultant index of the peak of this cross correlation is used as a shift in determining if the current frame of data is corrupted by motion.

During the first pass through the data frames, the sequence runs as it would have with no real time processing. However, the shifts for each frame are still computed and kept track of in a histogram. At the end of this first pass, a complete data set has been acquired along with an accurate measure of the relative motion of each frame of data. It is now possible to reacquire data frames employing a reacquisition strategy that makes use of the motion information. Analysis of the histogram should provide a region of points which are relatively stationary with respect to other points. These points can be found using the mean, median, mode, or some more detailed centering algorithm. However, keeping in mind the application of tracking motion in the chest and abdomen, the mode is currently used. This is because the respiratory cycle has a somewhat one-sided distribution over time, with the highest region of time located at the end point of expiration. The mode of the shifts in the histogram then provides a reasonable estimate of this point in the respiratory cycle.

After this mode is found, between the acquisition of the last frame of data in the preliminary pass and the first reacquisition, the distance of each data frame from the mode is computed. The frame of data that is furthest from the mode in absolute pixel distance is the next one to be reacquired. After this has been reacquired, the histogram is updated, and the process is repeated. In this way, each subsequent reacquisition always occurs on the worst frame of data. Since more time during the respiratory cycle is spent in the relaxed position of expiration than in any other part, the reacquisitions of frames will have a greater chance of falling closer to the mode than they previously were, especially since the reacquisitions will always be occurring on the worst current data frame. In this way, the variance among the sample points on the histogram is constantly decreasing, leading to the diminishing variance.

It is important to remember that by the end of the first pass through the scan, a complete image has been obtained. Each subsequent acquisition serves only to make the resultant image more motion free. The scan can be stopped at any time after the first pass, and an image can be reconstructed. The longer the scan runs during the reacquisition stage, the better the image will be in terms of motion artifacts. However, a point is eventually reached where the image is as motion free as the resolution of the cross correlation can possibly detect. At this point, extra scan time will not change the image appreciably. This provides the first stopping criterion for the reacquisition of data. If, after a reacquisition, all of the data frame shifts fall into an acceptable range of motion as determined by the application and the resolution of the navigators, then reacquisition is complete, and the data set is as motion free as the navigators can detect. Alternatively, if during reacquisition the "worst" data frame does not improve after several reacquisitions, then the scan can stop since subsequent reacquisitions will not improve the image significantly. Another stopping criterion is the total time limit of the scan. This again depends on user input and the particular application, but it is clear that some maximum total scan time should be set so that the scan cannot possibly run forever. When using the acceptance/rejection algorithm, successful scans usually fell in the range of 2.5 to 4 times the scan time of a normal scan, indicating that the stationary expired position represents about a quarter to a third of the respiratory cycle. For this reason, a reasonable maximum allowable scan time for the diminishing variance algorithm is three to four times the normal scan time of the sequence. If this maximum is reached before the first stopping criterion, the scan will stop at this point. The resultant image is as motion free as could be acquired given the time constraint. Preliminary experiments have shown that with a maximum allowable time of three times the normal scan time, the images demonstrate dramatic reduction in motion artifacts even when they reach the maximum scan time before stopping via the first criterion. Images demonstrating this will be presented below.

Figure 4B:
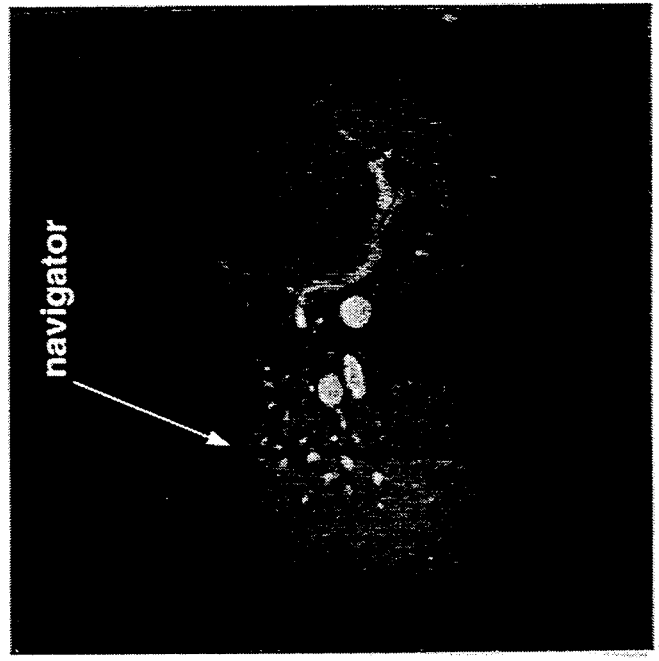
FIGS. 4A, 4B are pictures of T1-weighted axial abdominal scans with no real-time processing and with processing in accordance with the invention.
Figure 4A:
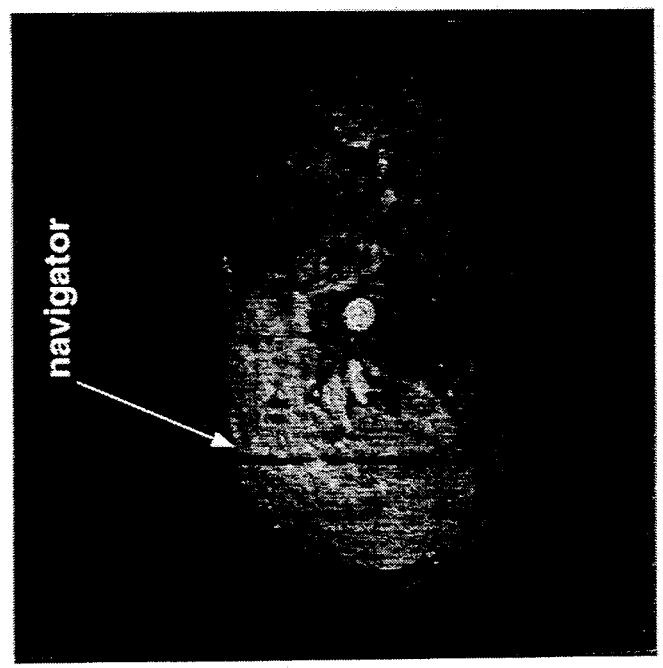

FIG. 4A shows the results of using an axial T1-weighted gradient-echo spiral sequence on the abdomen without any real-time processing. The scan was done on a normal volunteer who was given no special instructions. No breath-holds or countdowns were given. Notice the motion artifacts present in the image. FIG. 4B shows the same abdominal study scanned with the same sequence. However, this time, the real-time diminishing variance algorithm was employed. Again, no special instructions were given to the volunteer, who was breathing normally. The scan reached the time limit of three times a normal scan, i.e., three times the time it took to complete FIG. 4A. Notice the dramatic reduction of motion artifacts, even though the scan did not reach the motion free state in the allotted time. The stripe across the left side of the two images shows where the navigator was applied, which detected motion in the inferior/superior direction, corresponding to the motion of the diaphragm. For consistency, the navigator was played out in image 4A as well, so that the two sequences would be identical. Both figures are 40 interleave, gradient-echo spiral acquisitions with TR=400 ms, FOV=32 cm, 5 mm slice thickness, and a 15 cm navigator applied along $k_z$. Scan time for FIG. 4A is 16 seconds. Scanning in FIG. 4B reached time limit of 48 seconds before stopping.

The images demonstrate the feasibility and potential clinical effectiveness of using a real-time motion detection scheme for images of moving structures. The extension of the invention from the acceptance/rejection algorithm to diminishing variance allows for a more efficient reacquisition strategy that has a definitive maximum scan time. Preliminary results on volunteers have shown dramatic reduction of breathing artifacts in abdominal and thoracic imaging.

During the reacquisition of magnetic resonance signals, lines can be selected not only based on relative motion but also, for example, on relative position in k-space. Data frames near the center of k-space contain considerably more energy than data frames far away from the center. While all of the data frames contribute to the overall image quality, the frames with more energy (near the center of k-space) should be given preference in reacquisition over frames with less energy. Thus a weighting factor is preferably applied to each scan data frame to indicate the relative importance of the data frame to image quality. Accordingly, both positional information (worst frame in a motion sense) as well as the relative importance of the frame (proximity to the center of k-space) must be considered. Spiral scans cover all of k-space starting at the origin, and all spiral scans have equal importance. However, in echo planar imaging, or 2DFT imaging, the proximity of scan frames to the center of k-space is important.

Basically, position information alone need not be the only determinant of which data frames to reacquire. Other criterion can be used in assigning weighting factors. The criterion can be proximity to the center portion of k-space, as noted above, but this need not be the sole criterion.

The invention possesses some inherent advantages over post-processing correction. It is a general technique, and should work equally well with any type of sequence. The method is robust with respect to different types of motion and makes no mathematical model of the underlying motion kinematics in a scan. Unlike correction through post-processing, the process functions identically on all types of detectable motion. As long as a motion is detectable, it is treated in the same way as any other type of motion. The method can be combined with a sequence that uses cardiac synchronization as with an electrocardiograph signal to cope with both cardiac and respiratory-dependent motion.

In addition, the SNR of the scan is not limited to what can be acquired in a breath-held. In fact, the scan is in no way limited by the patent's ability to hold his or her breath. This is especially advantageous for uncooperative patients who have poor breath holding ability. The real-time algorithm should also help with the problem of slice registration. Since the scan is not restricted to a breath-hold, data from all slices, or even a 3D data set, can be acquired form one reference position. This rids the resultant data set of slice registration problems in much the same way as it rids it of motion artifacts. In fact, slice registration problems arise from through-plane motion, and are simply motion artifacts in that dimension. This has been a problem in scans using successive breath-holds with no feedback.

While the invention has been described with references to specific embodiments, the description is illustrative of the invention and is not to be construed as limiting the invention. Various applications and modifications might occur to those skilled in the art without departing form the true spirit and scope of the invention as defined by the appended claims.

What is claimed is:

1. A method for reducing motion artifacts in magnetic resonance images comprising the steps of
   a) acquiring magnetic resonance image signals for multiple image frames,
   b) acquiring relative position data for each image frame,
   c) developing a histogram of positional shifts in frames based on said relative position data, and
   d) reacquiring magnetic resonance signals for selected image frames to reduce positional variance in said histogram.

2. The method of claim 1 and further including the steps of
   e) updating said histogram of positional shifts using relative position data for reacquiring signals for said selected image frames, and
   f) reacquiring magnetic resonance signals for selected image frames to reduce positional variance in the updated histogram.

3. The method as defined by claim 2 wherein steps e) and f) are repeated iteratively until an acceptable range of motion in all frames is realized.

4. The method as defined by claim 2 wherein steps e) and f) are repeated iteratively until a scan time limit is reached.

5. The method as defined by claim 1 wherein relative position data in step b) is provided by a navigator in each frame.

6. The method as defined by claim 1 wherein step c) includes obtaining a cross correlation between a reference projection and a test projection associated with each frame of data as a measure of motion shift.

7. The method as defined by claim 1 wherein each frame is an interleaved spiral acquisition.

8. The method as in claim 7 wherein all frames are interleaved spiral acquisitions.

9. The method as defined by claim 1 wherein step b) determines positional variance based on a centering algorithm.

10. The method as defined by claim 9 wherein said centering algorithm uses a value selected from the group consisting of mean, median, and mode.

11. The method as defined by claim 1 and further including after step b) the step of weighting each image frame, and step c) includes developing a histogram of weighted positional shifts.

12. The method as defined by claim 11 wherein a weighting factor is based on image frame position in k-space with frames near the center of k-space having greater weight.

13. The method as defined by claim 1 wherein each frame is a 2DFT acquisition.

14. Apparatus for providing magnetic resonance imaging signals with reduced motion artifacts comprising
   a) means for acquiring magnetic resonance image signals for multiple image frames,
   b) means for acquiring relative position data for each image frame,
   c) means for developing a histogram of positional shifts in frames based on said relative position data,
   d) means for reacquiring magnetic resonance signals for selected image frames to reduce positional variance in said histogram, and
   e) means for using said magnetic resonance signals including reacquired magnetic resonance signals to produce an image.

* * * * *